United States Patent
Knight

(10) Patent No.: US 9,326,418 B2
(45) Date of Patent: Apr. 26, 2016

(54) UNIFIED NETWORK CONNECTION DEVICE

(71) Applicant: Paul A Knight, Spokane, WA (US)

(72) Inventor: Paul A Knight, Spokane, WA (US)

(73) Assignee: KnuBox, LLC, Spokane, WA (US)

( * ) Notice: Subject to any disclaimer, the term of this patent is extended or adjusted under 35 U.S.C. 154(b) by 14 days.

(21) Appl. No.: 14/332,402

(22) Filed: Jul. 16, 2014

(65) Prior Publication Data

US 2016/0021779 A1    Jan. 21, 2016

(51) Int. Cl.
*H05K 7/18*    (2006.01)

(52) U.S. Cl.
CPC ...................................... *H05K 7/186* (2013.01)

(58) Field of Classification Search
CPC ......... H04Q 1/13; H01R 13/74; H01R 13/748
USPC ...................................... 439/540.1, 539, 557
See application file for complete search history.

(56) References Cited

U.S. PATENT DOCUMENTS

| | | | |
|---|---|---|---|
| 4,073,563 A | 2/1978 | Bailey et al. | |
| 5,055,067 A | 10/1991 | Field | |
| 5,129,842 A | 7/1992 | Morgan et al. | |
| 6,866,541 B2 | 3/2005 | Barker et al. | |
| 7,163,423 B1* | 1/2007 | Peters | H01R 13/518 439/540.1 |
| 7,544,090 B2 | 6/2009 | Follingstad | |
| 7,591,676 B2 | 9/2009 | Martich et al. | |
| 8,382,515 B2 | 2/2013 | Caveney et al. | |
| 8,404,974 B1* | 3/2013 | O'Connor | H01R 4/2433 174/100 |
| 8,444,432 B2 | 5/2013 | Byrne et al. | |
| 2005/0221660 A1 | 10/2005 | Coffey et al. | |
| 2007/0184712 A1* | 8/2007 | Martich | H01R 13/74 439/540.1 |
| 2009/0242265 A1* | 10/2009 | Doorhy | H05K 7/1457 174/494 |
| 2011/0159726 A1* | 6/2011 | Wang | H01R 13/518 439/540.1 |
| 2012/0062086 A1* | 3/2012 | Garza, Jr. | H05K 5/0213 312/236 |
| 2014/0037259 A1 | 2/2014 | Bragg | |

OTHER PUBLICATIONS

Telect Inc, Modular 1RU Multifunction System Datasheet, 8 pages, Apr. 2013.

* cited by examiner

*Primary Examiner* — Tulsidas C Patel
*Assistant Examiner* — Marcus Harcum
(74) *Attorney, Agent, or Firm* — KnuBox, LLC

(57) ABSTRACT

A system for facilitating the design, installation and reconfiguration of physical connections in a network. One or more application modules interface with a chassis to create configurations for particular network needs. Different chassis can used for different network applications, such as a rack, housing or desk. A module tab, a faceplate protrusion and a mounting fastener provide a simple method for securing a module to the chassis through a chassis opening. The faceplate module is secured to the chassis and jacks are secured to the faceplate through the use of a jack plate. The jack plate fits through the opening of the chassis. The resulting connection module allows cables to come pre-terminated to a jack plate or cables can be assembled to a complete module. This allows a user to install jacks from the back of a rack or front of a rack.

17 Claims, 12 Drawing Sheets

UNIFIED NETWORK CONNECTION DEVICE

CROSS REFERENCE TO RELATED APPLICATION

There are no related applications.

STATEMENT REGARDING FEDERALLY SPONSORED R&D

Not related to this application.

TECHNICAL FIELD

This invention relates to devices that provide physical connections in a network, more particularly to a physical layer multi-use network device that is suitable for use in a wide range of networks, speeds, installations, and can be configured and reconfigured for particular applications.

BACKGROUND OF THE INVENTION

The network physical layer is well understood in the fields of computing, networking and telecommunications. The functions of the network physical layer includes providing power, structure and cabling as needed to network equipment nodes, such as computers, routers, switches and transport equipment. Power is used to provide electricity to network equipment nodes and includes devices, such as but not limited to, power cables, power backup devices and power monitoring. Structure for network equipment nodes includes devices, such as but not limited to, racks, cabinets, boxes and enclosures. Cabling for network equipment nodes includes devices, such as but not limited to, cabling, connectors, adapters and cable routing devices.

Due to its maturity, the network physical layer is also fairly well understood by people in non-networking fields through network use in homes, offices, schools, hospitals and concert arenas. Information on the network physical layer, at different technical levels, can readily be found in books, papers, blogs and patents. Today, many people know of products that provide power, space and connectivity to network devices.

Structure for network equipment nodes is usually a rack or housing made from plastic or metal, or those in combination. In home applications the housing could provide restricted assess from children. In wiring closets and network rooms for business, the common channel rack provides the ability to stack equipment providing better utilization of building space. In data centers, the server rack or server cabinet can provide both density and security. Often the structure provides spools, tie downs and routing arcs allowing the user to better manage cabling. Recently, thermal management of networking equipment nodes has become important. The structure of the networking nodes often includes rack mounted blanking plates for separating hot aisle—cold aisle architectures. For similar reasons, rack mounted brush strips allow cables, not air, to go from the one side of the rack to other.

Power for networking equipment nodes is supplied as alternative current ("AC") or direct current ("DC") current at a wide range of voltages. Home and office computers typically plug into common household AC electrical wall outlets or to power strips. More computing intense applications, such as computer rooms at a business or datacenters, typically use vertical power strips mounted along a rack or smaller horizontal ones mounted within a rack space. Power has been commonly connected in the back of racks, but U.S. Pat. No. 8,472,183 to Ross et al. describes benefits for placing the power in the front of a rack. Telecommunication networks often use DC power panels that connect and provide overcurrent protection to network equipment nodes. There are a great number of power distribution products in the market supporting all the different power types and network applications.

Patch panels are a common cabling element in the physical layer of networks. Patch panels provide a location for two cables to be joined together to make a circuit. Cable types range from twisted pair, coax to fiber optic. There are a great number of actual connector types that can be applied to the ends of cables. For example, twisted pair cables used in data networks often have RJ type connectors. Coaxial cables often have BNC, TNC, SMA and type N radio frequency matched cables. Fiber optic cables can often have SC, LC, FC, ST and MPO type connectors. In addition, cables can be connected with splices, pins, sockets, punch down blocks, binding posts and terminal strips, all are considered jacks herein. Patch panels provide installation flexibility, test access points, and the ability to reconfigure connections to network equipment nodes.

With the maturing of network technologies and constant introduction of new ones, many individual network locations have become conglomeration of multiple types of racks, cables, connectors and network equipment nodes. These applications can become hard to manage, hard to scale, become cable congested causing thermal problems, or result in less than optimal utilization of space.

A prior art product that allows reconfiguration of a network is the 1RU Multifunction System from Telect, Inc (disclosed in the IDS for this application). The product has modules that fit within a chassis housing. A limitation of the product is that the design forces the module to be installed only from the front of the chassis. Another limitation is that the modules do not have a common jack interface that allows a module to support many different types of jacks—the modules are jack dependent. Another limitation is that the modules do not allow an installer to mix and match types of jacks within the same module. Another limitation is that individual jacks cannot be field installed with pre-terminated cabling. Another limitation is the module depth does not allow a user to access the back of a fiber optic jack without removing a module from a chassis and opening the module cover.

With network speeds continuing to increase, the quality of terminations and connections have become more important. Today's patch panels are usually terminated with cables in the field. Congested spaces, the need for installers to go from the front of a rack lineup and to the back, are examples of conditions that complicate and slow down installers.

One recent invention to speed up installations is U.S. patent application Ser. No. 13/564,495 to Bragg. A user can install a plurality of connections in a housing to the back of a patch panel. A limitation of the invention is that the connector housing cannot be installed from the front of an installed panel because the plurality of jack sized panel openings are much smaller than the connector housing. Another limitation is that because the housing connects directly to the panel chassis, the function of the jack housing is limited to the function of the cutouts in the panel. The invention is limited to patch functionality and does not allow installers to configure the panel for applications other than patching.

In these respects, the unified network device according to the present invention substantially departs from conventional concepts of the prior art and in doing so provides a patch panel framework designed for the purpose of providing design flexibility, scalability, ease of installation, and management for the physical layer of networks.

SUMMARY OF THE INVENTION

The present invention therefore is directed at improving and facilitating the design, procurement, installation, use, and reconfiguration of the physical layer of networks. The present invention creates a unique module form factor for creating different modules that provide different physical layer functions, such as connectivity, power, and thermal management. The modules can be used within standard form factor chassis, thus simplifying training and knowledge of different systems. The modules are designed to allow users to install pre-cabled connectivity versions from the front or back of a rack, thus reducing installation time and providing factory tested connections. By creating interchangeable modules that provide power, structure, cable management and connectivity, many elements of the physical layer of the network can be unified into a common framework. The framework of the present invention allows network engineers to provide significant, or little, customization in the field.

These and other features, aspects, and advantages of the present invention will become better understood with regard to the following description, appended claims, and accompanying drawings.

BRIEF DESCRIPTION OF THE DRAWINGS

Preferred embodiments of the invention are described below with the reference to the following accompanying drawings.

DETAILED DESCRIPTION OF THE PREFERRED EMBODIMENTS

Many of the fastening, connection, manufacturing and other means and components utilized in this invention are widely known and used in the field of the invention are described, and their exact nature or type is not necessary for a person of ordinary skill in the art or science to understand the invention; therefore they will not be discussed in detail. Furthermore, the various components shown or described herein for any specific application of this invention can be varied or altered and anticipated by this invention and the practice of a specific application or embodiment of any element may already be widely known or used in the art, or persons skilled in the art or science; therefore, each will not be discussed in significant detail.

The term "cable" as used herein, without limitation, is used to describe any network cable. More specifically, the term cable includes, but is not limited to, signal carrying cables such as twisted pair, coaxial and fiber optic cables, as well as power cables used to deliver AC or DC power to a network equipment node.

Figure 13:
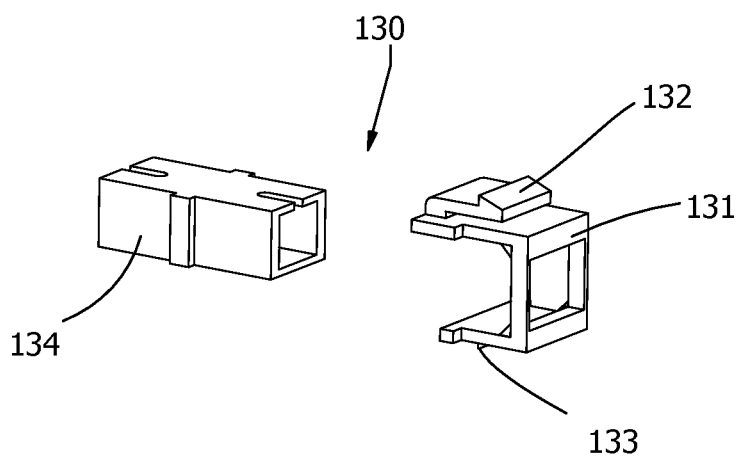
FIG. 13 is a front perspective view of a standard fiber optic adapter before insertion into a keystone carrier.
Figure 14:
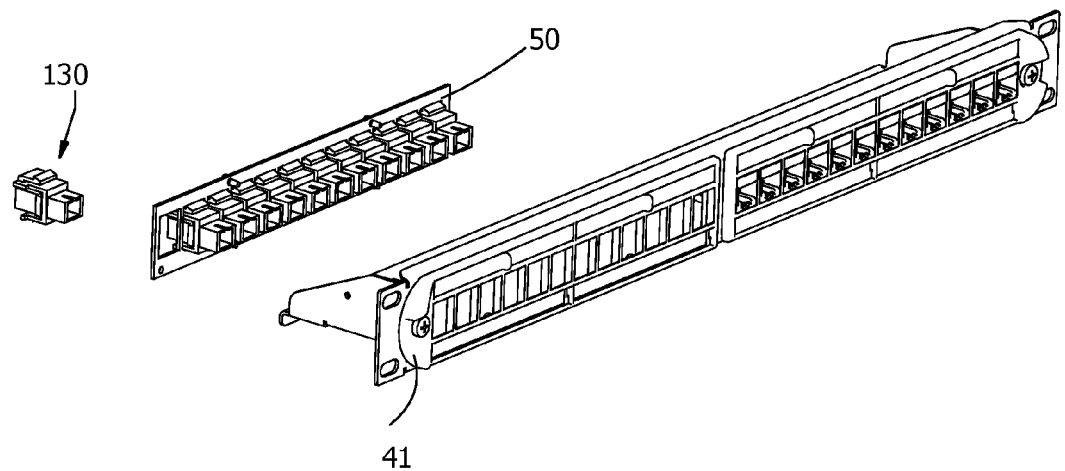
FIG. 14 is a front perspective view of a jack plate having keystone fiber optic adapters installed.

The term "jack" as used herein, without limitation, is used to describe any standard network connection for connecting cables. Common jacks include RJ versions, such as the RJ11 jack for telephone service and the RJ45 version for connecting four pairs of twisted cable. The term jack is also intended to include fiber optic adapters such as simplex, duplex and MT-RJ multi fiber versions. Also included in the term jack are audio video type jacks such as HDMI, USB, bantam and coaxial connectors. The term jacks as used herein also includes lug-terminals and screw-terminals for connecting power cables. A convenient interface for different jacks is a keystone jack assembly 130 as shown in FIG. 13 and FIG. 14. A plastic housing 131 has a clip 132 and a wedge 133 and houses a jack, such as fiber optic connector 134. Keystone jacks are well known in the art for allowing multiple styles of jacks to work within the form factor of an RJ-45 jack. Therefore it should be appreciated that the RJ-45 jacks shown in the assembly figures can be replaced by a wide range of jacks in the form factor of keystone jack assembly 130. The present invention should not be construed to be limited to any particular jack.

Figure 1:
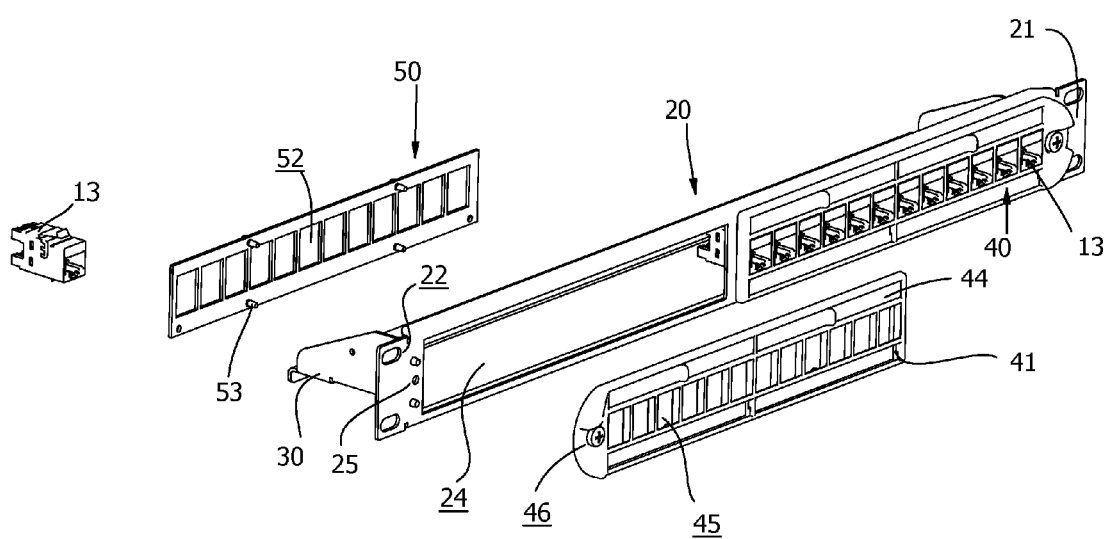
FIG. 1 is a front perspective view of a unified network connecting device according to the present invention. The view shows the embodiment of a RJ jack module in both its unassembled and assembled state.

FIG. 1 shows an RJ jack version of a unified network connection device 20 according to the present invention. Network connection device 20 is comprised of a chassis 21 and one or more jack modules 40. The arrangement of elements shown, provide a preferred embodiment according to the present invention, for use within a standard network rack. It should be immediately appreciated that other chassis configurations can be suited for alternative network applications without departing from the scope and intent of the present invention.

Figure 11:
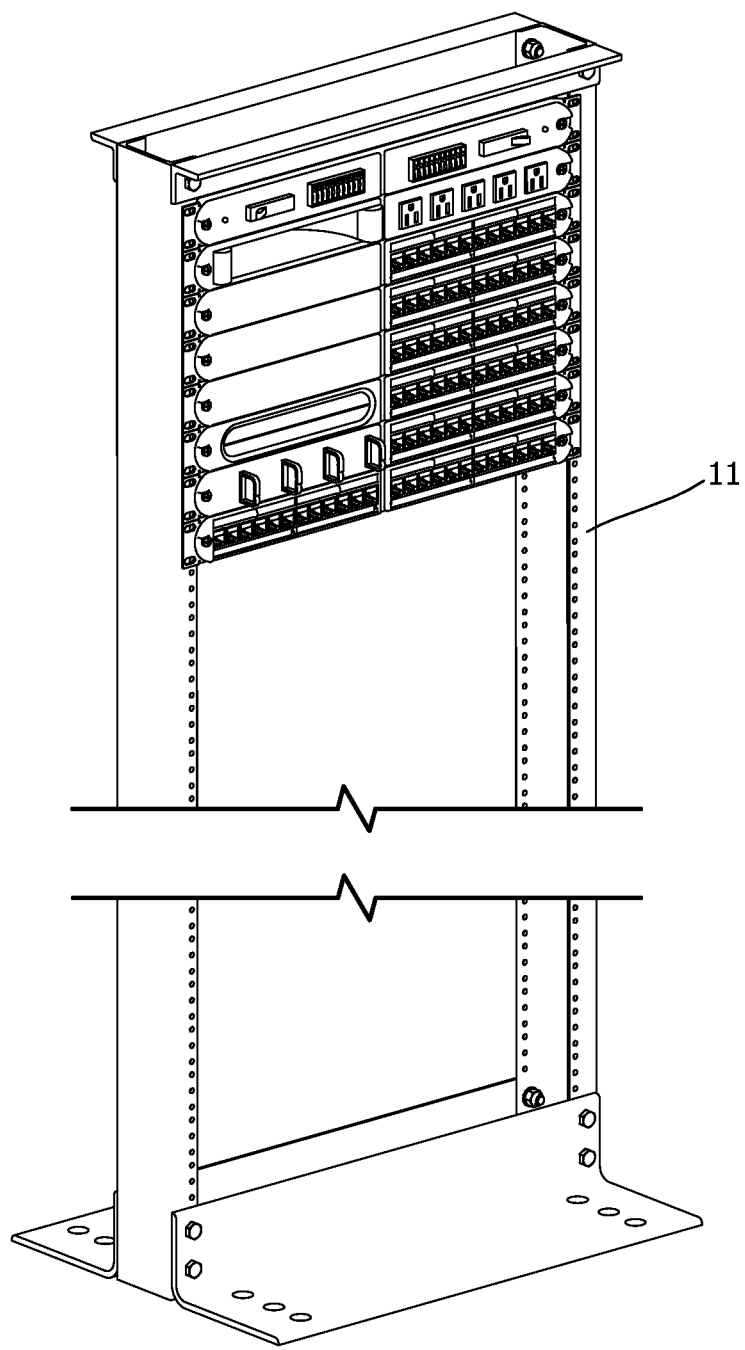
FIG. 11 is a front perspective view a network rack having a plurality of unified network connecting device, the network rack is broken to better provide detail.
Figure 12:
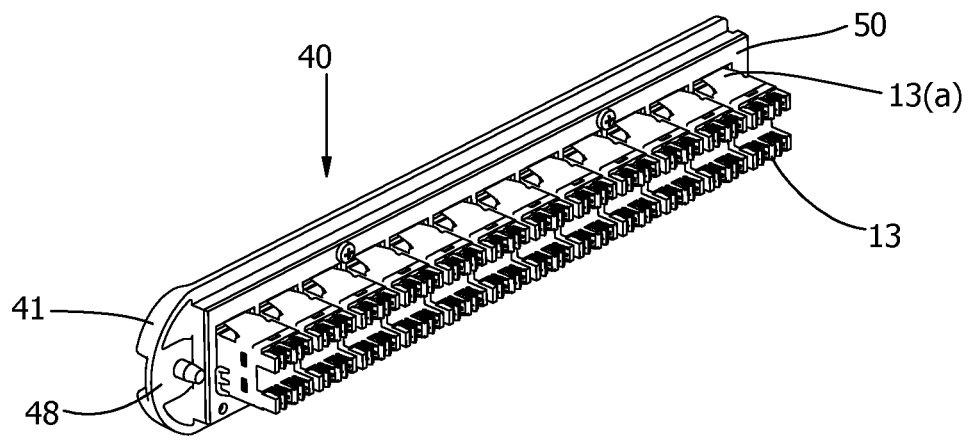
FIG. 12 is a rear perspective view of an assembled module according to the present invention.

Chassis 21 is shown in a 1U version as commonly understood in the field of networking. As shown, chassis 21 is ideally suited to take up 1.75 inches of vertical rack space and attach to both rails of a network rack 11 (FIG. 11). Wider and narrow racks are available which would extend or shrink the width of chassis 21. Chassis 21 has a front chassis surface 22 and a rear chassis surface 23. Through both front chassis surface 22 and rear chassis surface 23 are a chassis opening 24. Attached to the rear surface 23 of chassis 21 is an optional cable manager 30. Cable manager 30 is used for securing cables (not shown) to chassis 21 so that unintended loads on cables do not pull cables from their jacks. A plurality of cable tie downs 31 allow for the use of plastic ties and removable hook and loop straps (not shown), both well understood in the field of networking. Cable manager 30 is secured to chassis 21 through the use of cable manager fastener 33. As shown, chassis 21 and cable manager 30 are made from powder coated 16 gauge sheet metal, but other materials can be appropriately used for different network and cabling configurations.

Figure 2:
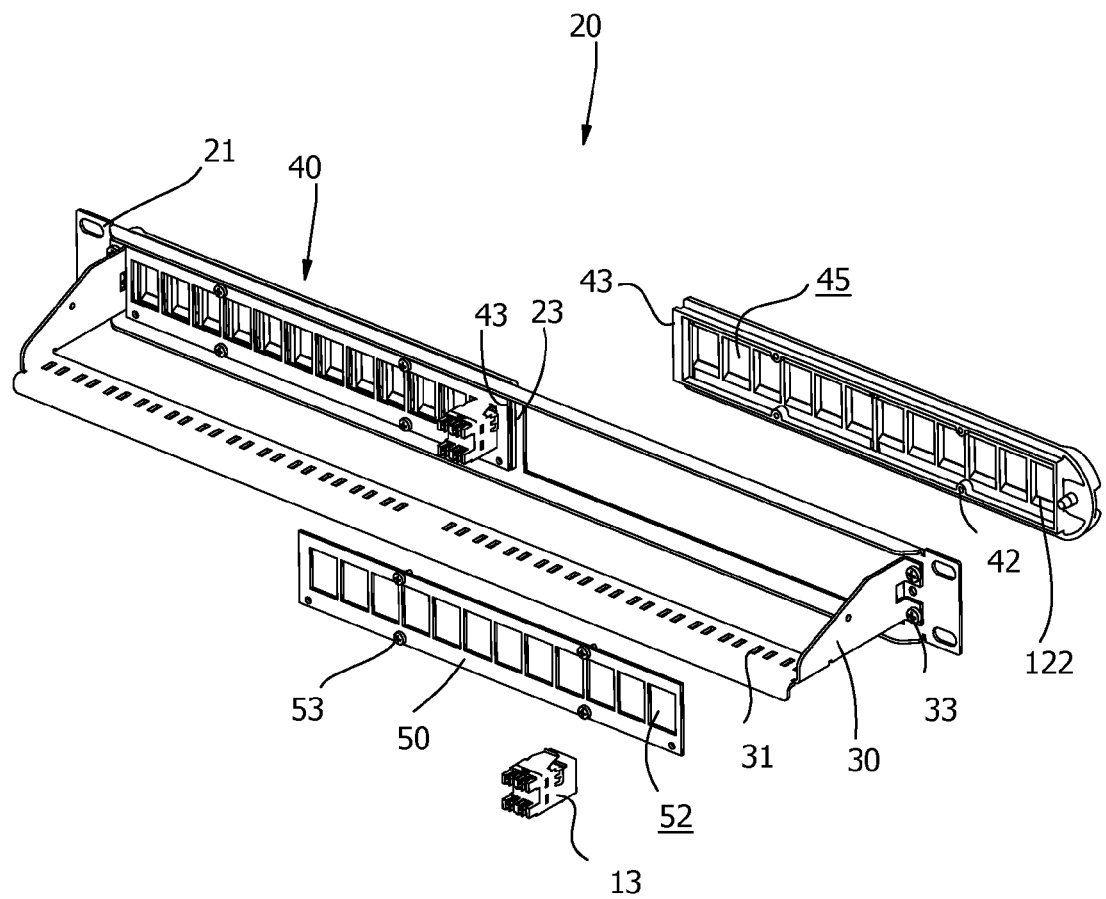
FIG. 2 is a rear perspective view of FIG. 1, with only one jack inserted into the assembled module.
Figure 3:
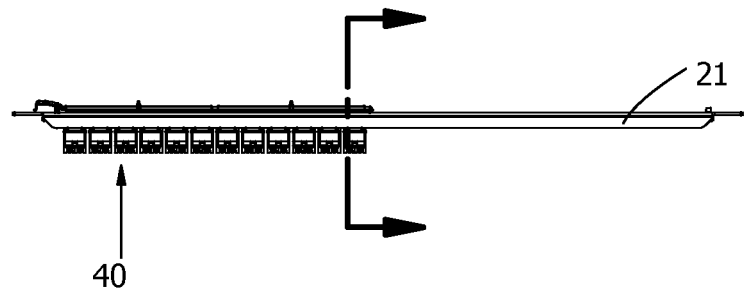
FIG. 3 is a top view of unified network connecting device according to the present invention. The view shows one module assembled to the chassis and provides a section line for FIG. 4.
Figure 16:
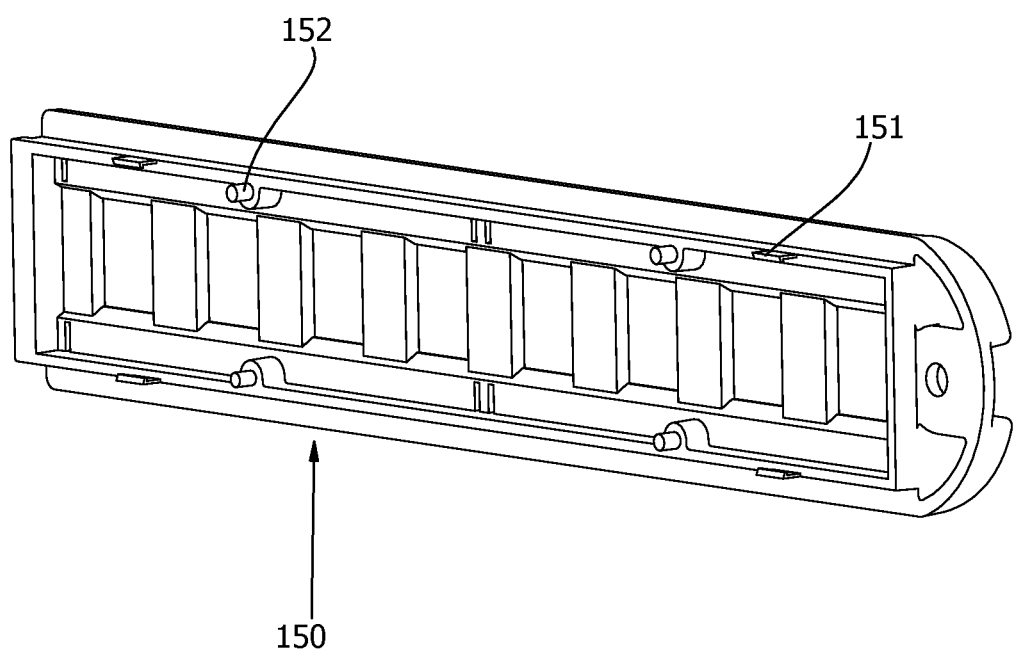
FIG. 16 is a front perspective view of an alternative snap faceplate embodiment wherein the faceplate snaps to a jackplate; and, FIG. 17 is a rear perspective view of an alternative cassette style jackplate embodiment.

Shown in both FIG. 1 and FIG. 2, a jack module 40 is shown assembled into the right side of chassis 21. Jack module 40 is also shown in FIG. 3 and the corresponding assembly section view of FIG. 4. Jack module 40 is comprised of a faceplate 41 and a jackplate 50. Faceplate 41 is preferably injection molded from a plastic having flame resistant properties, but metallic material from a process such as die casting can be appropriate for applications needing RF shielding or additional load resistance. Faceplate 41 has a front surface 49 and a rear surface 48. Front surface 49 includes designation surface 44 providing a user a place to record circuit information. Rear surface 48 of faceplate 41 includes a rectangular protrusion 47 and faceplate mounting holes 42 for mounting jackplate 50 through the use of a plurality of jack plate fasteners 53. Jackplate fasteners 53 provide a secure and simple connection method, but it should be appreciated that the connection method between jackplate 50 and faceplate 41, without departing from the spirit and scope of the present invention, could be a fastener such as 152 a snap feature or a quarter turn fastener. FIG. 16 shows one alternative embodiment of a snap feature for securing a jackplate. A snap faceplate 150 includes a plurality of faceplate snaps 151 for securing to jackplate 50. This method provides a push insertion for jackplate 50 which could make installation easier. A plurality of alignment pins 152 can interface with mounting holes in jackplate 50 to facilitate alignment during assembly.

Jack faceplate 41 is mounted to chassis 21 through the use of rectangular protrusion 47, a module fastener 46 and a faceplate tab 43. Rectangular protrusion 47 fits through chassis opening 24 and restrains jack module 40 in the plane of chassis surface 22. Faceplate tab 43 extends outside opening 24 and touches chassis rear surface 23 and also provides vertical limitations similar to protrusion 47. Module fastener 46 and tab 43 keep rear faceplate surface 48 in contact with front chassis surface 22. Attaching faceplate 41 to chassis 21 is done by inserting tab 43 through opening 24 and having tab 43 make contact with chassis rear surface 23. Faceplate 41 is rotated towards chassis 21 with protrusion 47 extending through opening 24 until faceplate rear surface 48 is in contact with chassis front surface 22. Fastener 46 keeps faceplate 41 secure to chassis 21.

Figure 4:
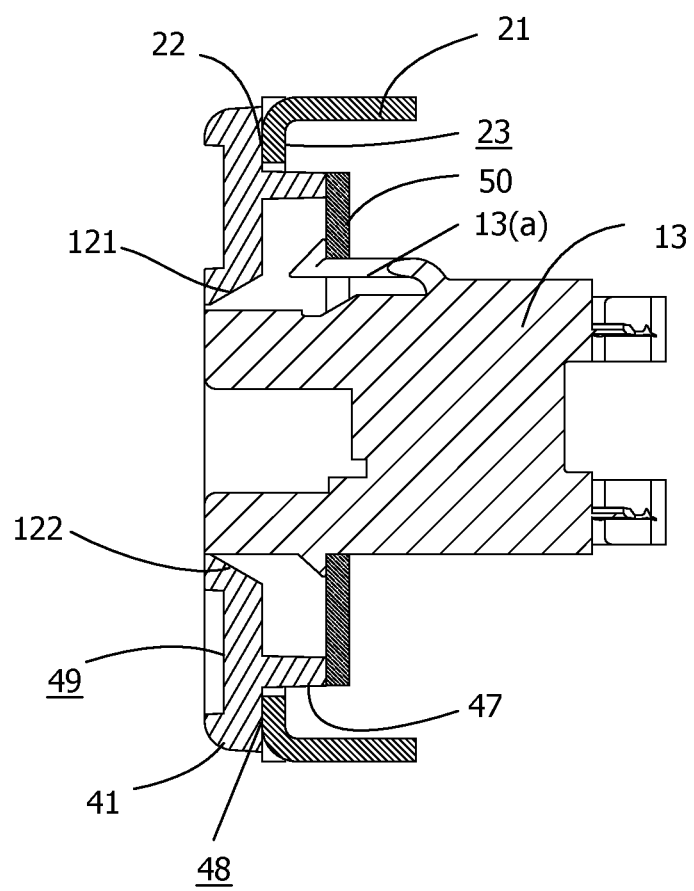
FIG. 4 is a section view from FIG. 3, and shows the connection methodology of a module according to the present invention.

Jackplate 50 has a plurality of jack openings 52 for use of mounting one or more jack 13. Jackplate 50 may be made from any suitable material or shape optimized for a particular type of jack, but for RJ and fiber type connectors plate 50 works with 16 gauge steel providing sixty thousandths of an inch panel thickness for the jacks to mount to. As previously described, the RJ configuration allows the use of keystone jacks for a wide range of jack styles. As shown in FIG. 4, many jacks have a metal or plastic clip 13(*a*) to restrain jack 13 to jackplate 50.

Jackplate 50 is secured to faceplate 41 through the use of fasteners 53. Jack plate 50 has dimensions near equal to protrusion 47 so that jackplate 50 can pass through chassis opening 24. Jack 13 mounted to jackplate 50 extends through a faceplate opening 45. With a force applied to jack 13, jack 13 might come in contact with opening 45 but jack 13 is not mounted to faceplate 41. Faceplate opening 45 has a top chamfer 121 to allow jack 13 to be rotated in place as commonly done for RJ jacks and keystone style jacks having clip 13(*a*). Faceplate 45 also has a bottom chamfer 122 to allow faceplate 45 to be symmetrical for left and right chassis installations.

The unified connection module according to the present invention provides installation flexibility for network designers, technicians and installers. The design and resulting mounting methods between cables, jack 13, chassis 12, faceplate 41, and jackplate 50 provide numerous ways for installers to assemble and efficiently use module 40 for a particular application. The following use descriptions are best applied to patch style modules, according to the present invention, but the options also apply to other module types, such as power modules. Connection methods for use are best shown in FIG. 4.

The first assembly and use option is "loaded panel" meaning the installer installs a chassis with modules loaded with jacks to a rack, and then terminates the jacks with cable. Prior to installation to a rack, one or more module 40 is installed to chassis 21 as previously described. Module 40 can be any type of module as previously described and includes faceplate 41, jackplate 50 and a plurality of jack 13 ("loaded" with jacks). Module 40 can be inserted into chassis 21 at a factory during ordering to simplify installation at the rack, or chosen and installed as needed for a particular application at the rack to simplify purchasing. Chassis 21, including one or more module 40 is installed to a rack for an installer to terminate rear cables. This installation option provides a standardized panel which an installer can choose rear cables for a particular application, such as Cat5E or Cat6. Standardization can be desirable to simplify debugging and maintenance of the same system across many sites, such as a central networking team of a bank managing systems in many different branches.

The second assembly and use option is "empty installed panel empty jack", meaning the user installs a chassis and empty modules to a rack, and then the user chooses and installs jacks and then terminates the jacks with cabling. This use is similar to that described above in the first use scenario, with the exception that jack 13 is not included in module 40 when it is installed in chassis 21. The resulting panel is installed into a rack. The installer then, or later as needed, chooses a particular jack for a particular application, such as picking a version of RJ45 jack or a fiber optic keystone jack. The installer then terminates jack 13 installed in the rack with the appropriate rear and front cabling for the application. This use method allows a network engineer to standardize a panel, but still provide the installer the flexibility to adapt a panel to the site specific jack and cable types. This use method simplifies the job of the network engineer.

The third assembly and use option is "empty installed panel pre-terminated jack", meaning the user installs a chassis having empty modules to a rack, and then the user chooses and installs a jack pre-terminated with cabling. This configuration and use option is similar to the second assembly and use option above, with the difference being that the installer inserts jack 13 with rear cabling already installed. The rear cabling can be done by the installer at a convenient location. Jack 13 can also be shipped from a factory with cabling attached. This option provide increased confidence in circuit performance and reduced time in the field.

The fourth assembly and use option is "empty non-installed panel", meaning the user installs jacks into modules that are mounted to a chassis. This configuration and use option is similar to the second and third options described above, with the exception that jack 13 is installed into the assembly of module 40 and chassis 21 prior to the final assembly being mounted to a rack. Jack 13 may be empty or pre-terminated with cabling. This option provides the ability to load jack 13 in module 40 in a more convenient location than at a rack, in trade for the reduced ability to configure jack 13 to a particular type at a later time after the panel is installed.

The fifth assembly and use option is "pre-terminated panel", meaning a user installs a chassis having modules filled with cable terminated jacks to a rack. This use option is similar to the first "loaded panel" option but includes that one or more jack 13 is pre-terminated with rear cables prior to the panel being installed into a rack. This option standardizes the complete assembly for the network engineer, reducing potential installation variations in trade for little ability to adapt at the installation site. This option also speeds installation time as rear cable terminations can be installed and tested prior to shipping, or done by an installer prior to showing up at a site.

The sixth assembly and use option is "empty installed chassis, preloaded module", meaning the user installs an empty chassis to a rack and then installs modules having jacks. This use option is similar to option one "preloaded panel" with the exception that jack 13 is installed into module 40 and that assembly is installed into chassis 21. Chassis 21 is already mounted to a rack. This configuration and use allows chassis 21 to be preinstalled into a rack prior to a module function being chosen.

The seventh assembly and use option is "empty installed chassis, empty module, empty jack", meaning the user installs a chassis to a rack and then installs a module not having jacks to the chassis. Individual jacks are later selected and installed and then terminated with cables. This use option is similar to the second and sixth use options with difference being that one or more jack 13 is installed after module 40 is installed into a chassis 21 installed in a rack. This option has benefits when an installer needs to pick a jack and module for an installed chassis.

The eight assembly and use option is "empty installed chassis, empty module, pre-terminated jack", meaning the user installs a chassis to a rack and then installs a module for a particular function to the chassis. Ultimately the user installs a pre-terminated jack to the module. This use option is similar to the third and seventh use options described above with the exception that jack 13 is installed pre-terminated with rear cables. This option has benefits when a quick high quality installation is needed but the jack type, or module type, is unknown when chassis 21 is installed.

The ninth assembly and use option is "empty faceplate rear loaded jackplate" meaning the user installs jackplate 50 to faceplate 41 mounted to chassis 21 which is mounted to rack 11. This configuration and use option is for providing a standard configuration with high quality factory terminated jacks when an installer prefers access to the rear of a rack. Chassis 21 is installed into a rack. Faceplate 41 is installed into chassis 21 as previously described. One or more jack 13 is installed into jackplate 50. Jack 13 may be terminated with cabling. Jackplate 50 is installed, along with jack 13 and cabling to faceplate 41 through the use of fastener 53. This use is ideal for situation when the application benefits from a high level of standardized but the installation benefits from installing a pre-terminated group of jacks.

The tenth assembly and use option is "empty faceplate front loaded jackplate" meaning the user installs jackplate 50 to a chassis 21 to a faceplate 41 that is then mounted to chassis 21 mounted to rack 11. This configuration and use option is for providing a standard configuration with high quality factory terminated jacks when an installer prefers access to the front of a rack. Chassis 21 is installed into a rack. One or more jack 13 is installed into jackplate 50, preferably at a location such as a factory. At the installation location and in front of a rack, jackplate 50 is installed, with jack 13, to face to faceplate 41 through the use of fastener 53. Cables ends are then inserted through chassis opening 24 and pulled until faceplate 41 can be installed to chassis 21 as previously described.

It should be appreciated through the different use scenarios that the chassis, faceplate and jackplate configurations and sizing provides substantial flexibility with respect to connecting modules. In addition to the use descriptions provided, others are possible with the present invention. The design of the chassis and faceplate also solves the problem of providing flexibility of different module functions that allow the chassis system to provide non-connecting functionality and be adaptive. Flexibility, standardization and adaptive are characteristics that simplify network deployments for engineers, buyers, installers and service personnel.

Figure 5:
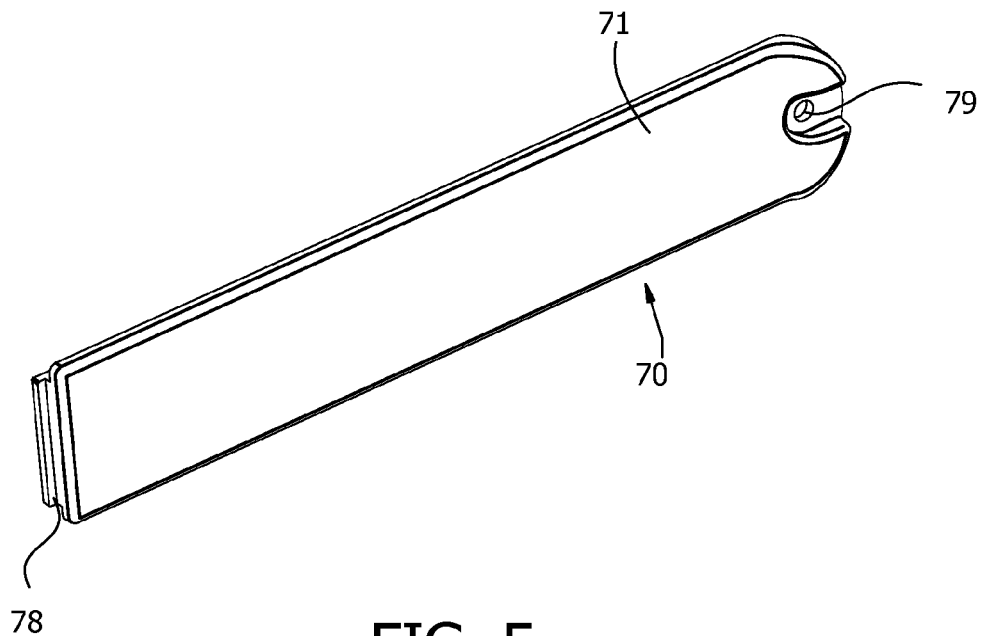
FIG. 5 is a front perspective view of a blanking module which is an alternative embodiment of the module shown in FIG. 1.

FIG. 5 shows an alternative module embodiment according to the present invention. A blanking module 70 is made from a blanking faceplate 71 which has a blanking faceplate tab 78 and a blanking faceplate mounting hole 79. Blanking module 70 is installed the same way as module 40 into chassis 21. Blanking module 70 can be used to stop airflow from going from the front of a rack to the back of a rack when no module is installed into chassis 21. Blanking module 70 can have artwork or printing as may be useful by the user. At any time, blanking module 70 can be removed from chassis 21 and another type of module inserted.

Figure 6:
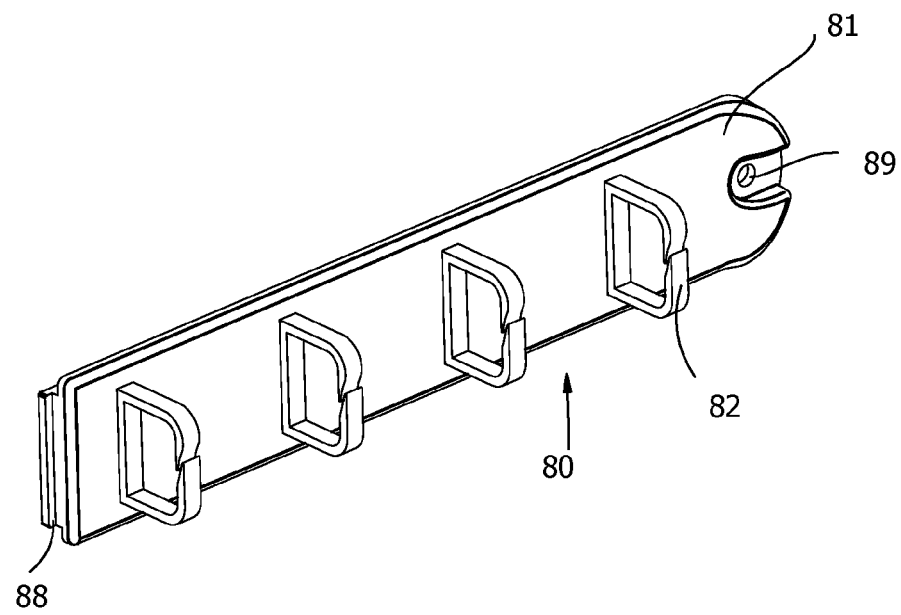
FIG. 6 is a front perspective view of a cable management module which is an alternative embodiment of the module shown in FIG. 1.

FIG. 6 shows an alternative module embodiment according to the present invention. A cable management module 80 is made from a cable management faceplate 81 having a cable management faceplate tab 88 and a cable management faceplate mounting hole 89. Cable management module 80 is installed the same was as module 40 into chassis 21. A plurality of cable management rings 82 mounted on the front surface of cable management faceplate 81 provide the ability to keep cables bundled together and routing in a desired direction. Although rings 82 are shown on the front surface of cable management faceplate 81, they could be mounted on the back surface or both the front and back surface.

Figure 7:
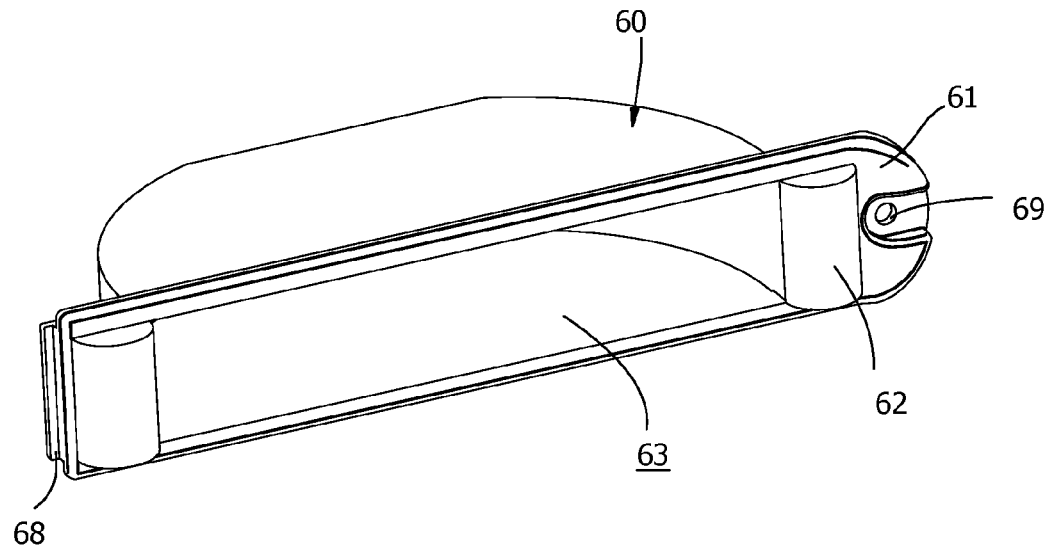
FIG. 7 is a front perspective view of a cable storage module which is an alternative embodiment of the module shown in FIG. 1.

FIG. 7 shows an alternative module embodiment according to the present invention. A cable storage module 60 is made from a cable storage faceplate 61 having a cable storage faceplate tab 68 and a cable storage faceplate mounting hole 69. Cable storage module 60 is installed the same was as module 40 into chassis 21. Cable storage module 60 has a set of transitions 62 which in combination with a storage opening 63 provide the ability to store excess amounts of cable in a rack. Storage module 60 may also be used for storage of tools and documentation.

Figure 8:
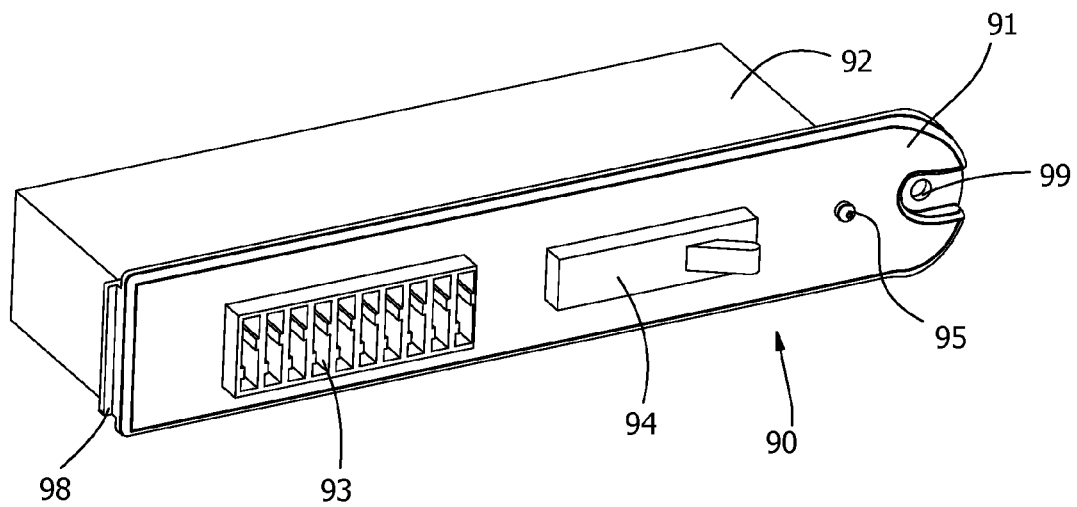
FIG. 8 is a front perspective view of a DC power module which is an alternative embodiment of the module shown in FIG. 1.

FIG. 8 shows an alternative module embodiment according to the present invention. A DC power module 90 is made from a DC power faceplate 91 having a DC power faceplate tab 98 and a DC power faceplate mounting hole 99. DC power module 90 is installed the same was as module 40 into chassis 21. DC power module 90 includes DC power housing 92 which fits through opening 24. Module 90 functions the same way as DC power panels common in the art. Module 90 has input power terminals which deliver power to output power terminals. A fuse block 93 and a breaker 94 provide over power protection between the inputs and multiple outputs. An indicator light 95 can indicate proper function or alarms.

Figure 9:
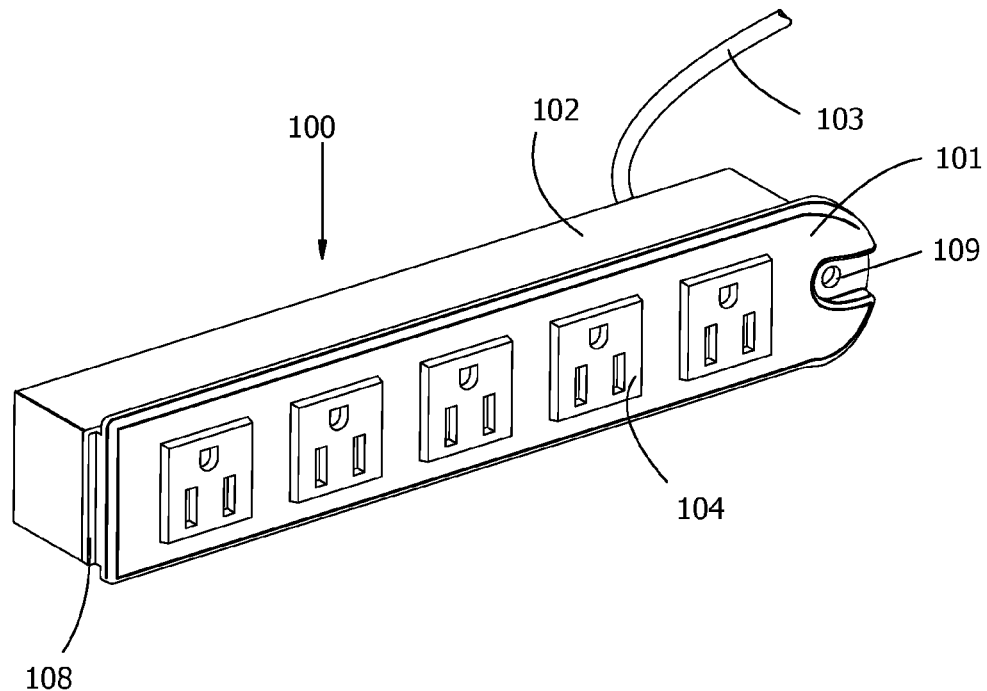
FIG. 9 is a front perspective view of a AC power module which is an alternative embodiment of the module shown in FIG. 1.

FIG. 9 shows an alternative module embodiment according to the present invention. An AC power module 100 is made from an AC power faceplate 101 having an AC power faceplate tab 108 and an AC power faceplate mounting hole 109. AC power module 100 is installed the same was as module 40 into chassis 21. AC power module 100 has an AC module housing 102 which protects internal wiring (not shown). An input cable 103 brings power to module 100 and power is distributed to one or more power outlets jacks 104. Module 100 works the same as commonly used and well known "power strips".

Figure 10:
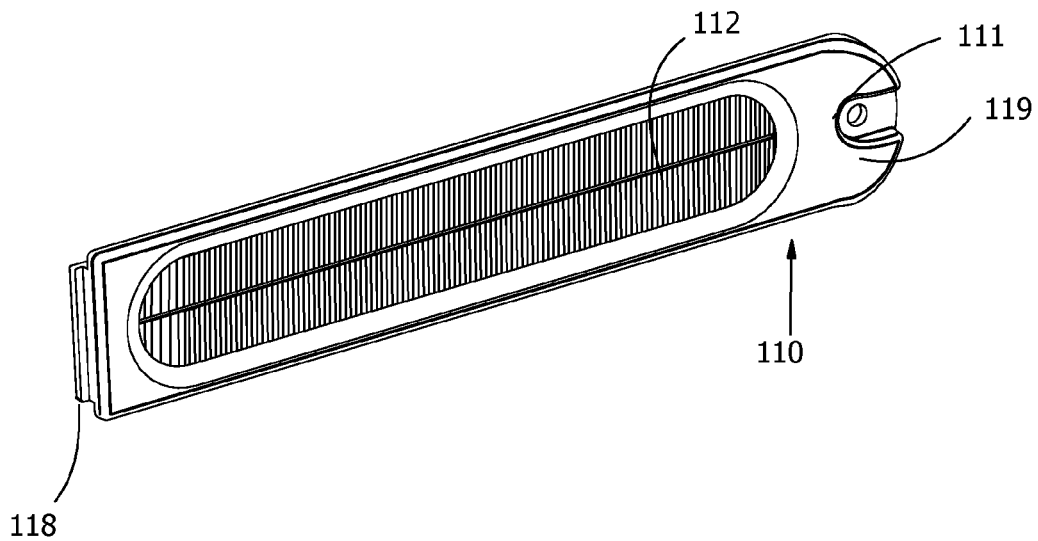
FIG. 10 is a front perspective view of a cable pass through module which is an alternative embodiment of the module shown in FIG. 1.

FIG. 10 shows an alternative module embodiment according to the present invention. A brush strip module 110 is made from a brush strip faceplate 111 having a brush strip faceplate tab 118 and a brush strip faceplate mounting hole 119. Brush strip module 100 is installed the same was as module 40 into chassis 41. Brush strip module 100 is used to allow cables to pass from one side of a rack to the other side while restricting air flow. Brush strips are well known in the art of computer networks.

Figure 15:
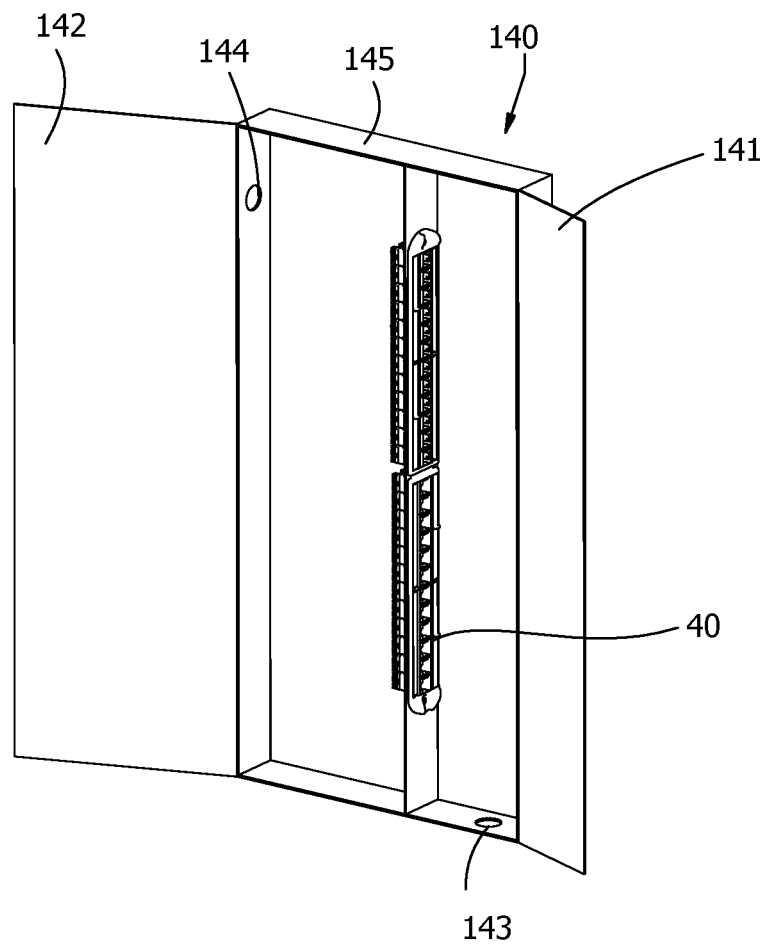
FIG. 15 is a front perspective view of an alternative wall mount chassis according to the present invention.

In addition to the alternative embodiments already described, other embodiments are possible without departing from the spirit of the present invention. A wide range of chassis are possible. For example, FIG. 15 shows a wall mount enclosure 140 having a wall chassis 145 having a semi-permanent side covered by redistricted access door 142 and having a cable inlet 144. The other side of enclosure 140 is an access side covered by a access door 141 and having a cable outlet 143. Between the two sides is one or more module 40. The same overall functions and benefits are contained in applications for chassis 145 as with chassis 21 for rack applications. A common module 40 reduces complexity across multiple network applications. Other chassis embodiments may include, but are not limited to, desks, conference tables, cabinets, and ladder racks applications.

Figure 17:
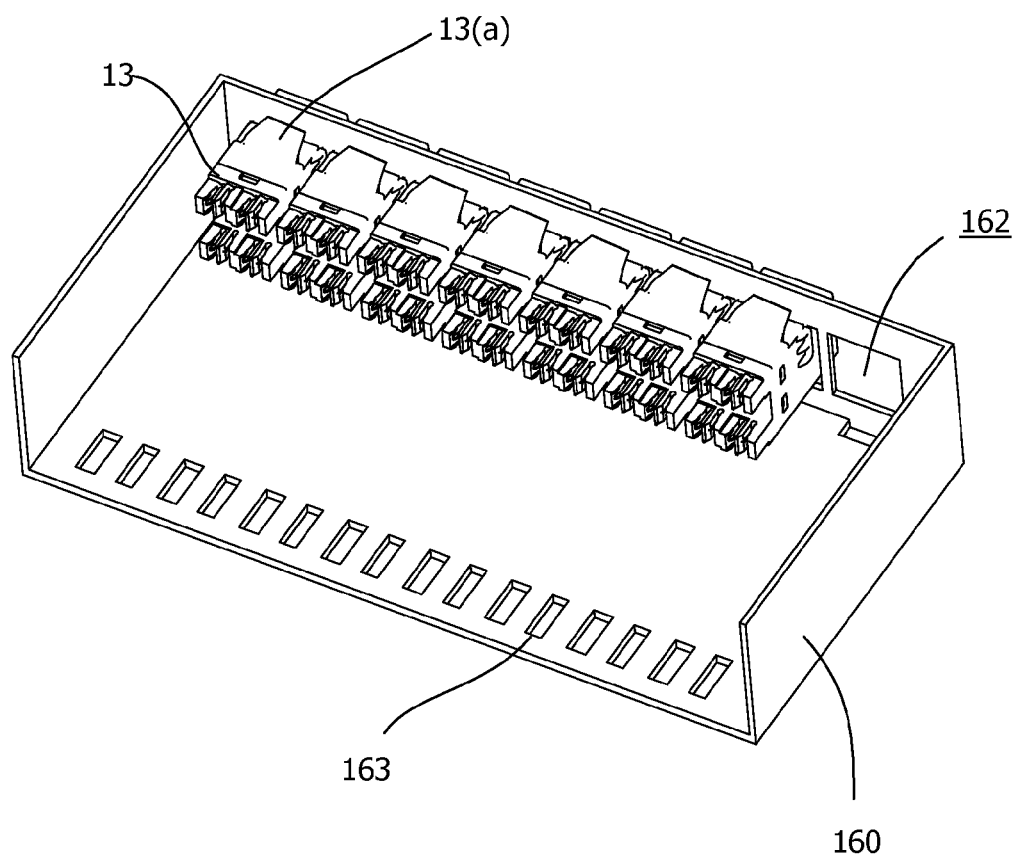

Yet another alternative embodiment is shown by FIG. 17. This alternative embodiment provides a cassette version of jackplate 50. Cassette jackplate 160 includes cassette holes 162 for mounting one or more jack 13 using clip 13(a). A plurality of cassette cable tie downs 163 provide strain relief for terminated cables (not shown). The resulting embodiment provides the ability to pre-terminate jacks with cables in a more secure fashion. The added space also provides the ability for fiber optic splices and splitters.

While the unified network connection device herein described constitute preferred embodiments of the invention, it is to be understood that the invention is not limited to these precise form of assemblies, and that changes may be made therein without departing from the scope and spirit of the invention as defined in the appended claims.

The invention claimed is:

1. A multifunction network system comprising:
a planar chassis have a front wall, said front wall having a front wall surface and a back wall surface;
at least one chassis opening extending through said chassis front wall;
a faceplate having a plurality of faceplate openings, said faceplate having a rear facing surface in contact with said front wall surface and a tab in contact with said back wall surface along a vertical edge of said chassis opening, said faceplate also having at least one fastener extending through a front faceplate surface and into said chassis;
a jackplate having a plurality of jackplate openings corresponding to each of said faceplate openings; and,
wherein said jackplate is removably mounted to said faceplate with said rear facing surface of said faceplate in contact with said front wall surface of said chassis.

2. A multifunction network system as recited in claim 1, wherein said jackplate includes an RJ style jack.

3. A multifunction network system as recited in claim 1, wherein said jackplate includes a keystone jack assembly.

4. A multifunction network system as recited in claim 1, wherein said jackplate includes a coaxial jack.

5. A multifunction network system as recited in claim 1, wherein said jackplate includes a power jack.

6. A multifunction network system comprising:
a planar chassis having a front wall with at least one opening, said front wall having a wall front surface and a wall back surface;
a module having a module front surface and a module back surface, said module back surface mounted to said wall front surface with at least one fastener accessible from said module front surface;
said module back surface having a rectangular protrusion extending through said at least one opening; and,
wherein said rectangular protrusion has a vertical tab in contact with said wall back surface along a vertical edge of said at least one opening.

7. A multifunction network system as recited in claim 6, wherein said module includes a jackplate mounted to said rectangular protrusion.

8. A multifunction network system as recited in claim 6, wherein said module includes a jackplate mounted to said rectangular protrusion, said jackplate having a plurality of jacks.

9. A multifunction network system as recited in claim 6, wherein said module includes a jackplate mounted to said rectangular protrusion, said jackplate having a plurality of removable jacks.

10. A multifunction network system as recited in claim 6, wherein said front surface includes a plurality of cable management devices.

11. A multifunction network system comprising:
a planar chassis have a front wall with at least one opening, said front wall having a wall front surface and a wall back surface;
a module having a module front surface and a module back surface, said module back surface mounted to said front wall surface with at least one fastener accessible from said module front surface;
said module back surface having a rectangular protrusion extending through said at least one opening, said protrusion in contact with said wall back surface;
a rear adapter plate secured to said rectangular protrusion; and,
a plurality of network connectors secured to said rear adapter plate.

12. A multifunction network system as recited in claim 11, wherein said plurality of network connectors are power connectors.

13. A multifunction network system as recited in claim 11, wherein said plurality of network connectors are power jacks.

14. A multifunction network system as recited in claim 11, wherein said plurality of network connectors are signal cable jacks.

15. A multifunction network system as recited in claim 11, wherein said module includes an opening and a brush within said opening.

16. A multifunction network system as recited in claim 11, wherein said module front surface includes a plurality of cable management devices.

17. A multifunction network system as recited in claim 11 wherein said rectangular protrusion includes a snap for removably capturing said rear adapter plate.

\* \* \* \* \*